United States Patent [19]

Forrest et al.

[11] Patent Number: 5,172,385
[45] Date of Patent: Dec. 15, 1992

[54] POLARIZATION-SELECTIVE INTEGRATED OPTOELECTRONIC DEVICES INCORPORATING CRYSTALLINE ORGANIC THIN FILMS

[75] Inventors: Stephen R. Forrest; Franky F. So, both of Torrance; De Y. Zang, Irvine, all of Calif.

[73] Assignee: University of Southern California, Los Angeles, Calif.

[21] Appl. No.: 665,429

[22] Filed: Mar. 5, 1991

[51] Int. Cl.⁵ .................. H01S 3/19; G02B 6/10
[52] U.S. Cl. .................. 372/50; 357/30; 385/11; 385/130; 257/431
[58] Field of Search .......... 385/129, 130, 11; 372/20, 50; 357/30 R, 30 G

[56] References Cited

U.S. PATENT DOCUMENTS

| | | | |
|---|---|---|---|
| 4,869,569 | 9/1989 | Kapon | 350/96.12 |
| 4,975,918 | 12/1990 | Morton | 377/20 |
| 5,058,971 | 10/1991 | Schmitt et al. | 385/130 |
| 5,101,469 | 3/1992 | Oda | 385/11 |

Primary Examiner—James W. Davie
Attorney, Agent, or Firm—Benman and Collins

[57] ABSTRACT

Certain crystalline organic semiconductor compounds, such as 3,4,9,10-perylenetetracarboxylic dianhydride (PTCDA), when deposited by an ultrahigh vacuum process of organic molecular beam deposition, form highly ordered "quasi-epitaxial" films (32). Due to asymmetries in the molecular crystal structure of such compounds, the ordering of the films results in giant asymmetries in their dielectric properties. Such large dielectric asymmetries permit the construction of a variety of devices, including optical isolators (38), optically isolated lasers (48), optical isolated optical amplifiers (64), polarization-selective photodiodes (76), and metal-organic-inorganic semiconductor-metal detectors, among others.

43 Claims, 5 Drawing Sheets

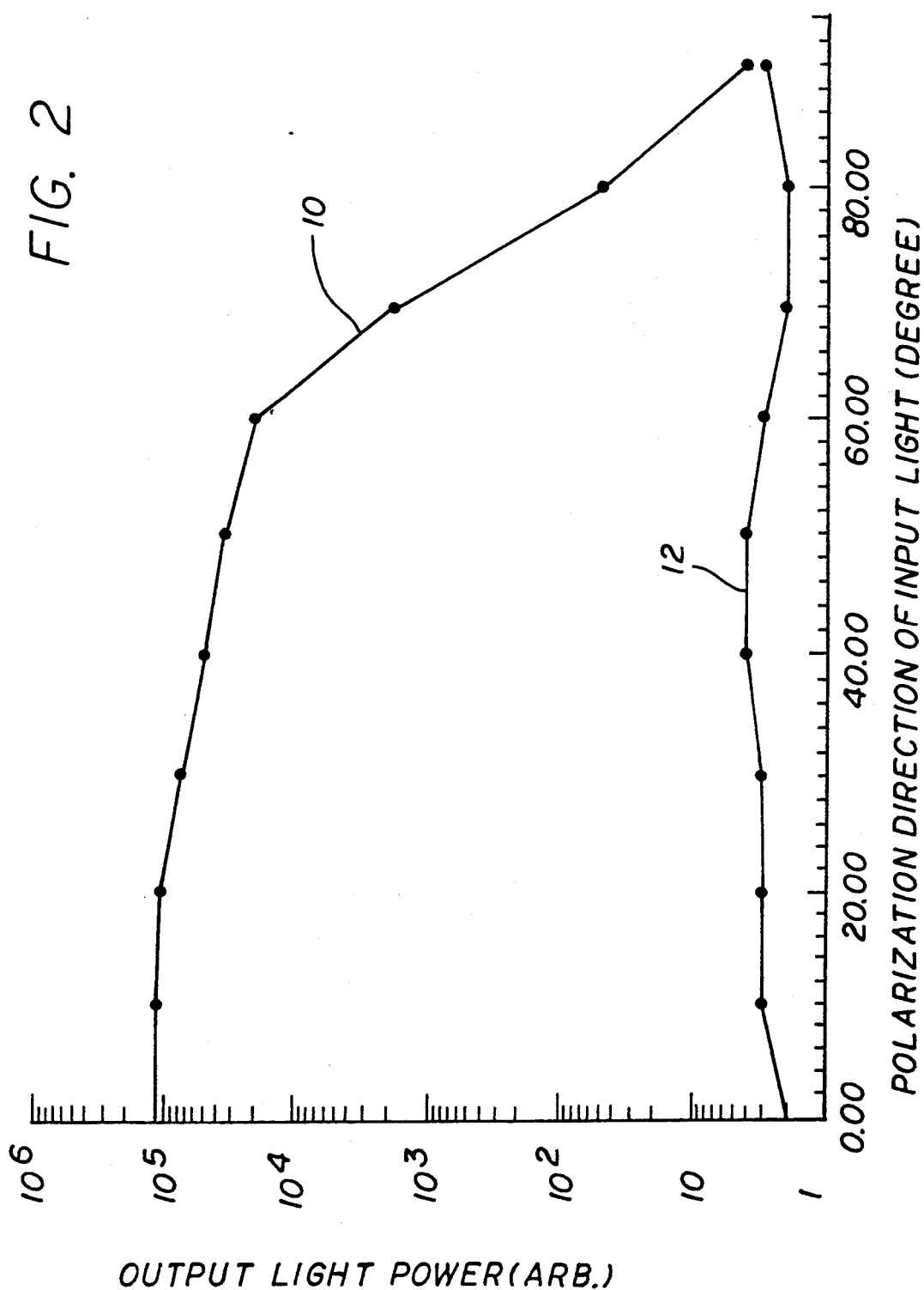

POLARIZATION-SELECTIVE INTEGRATED OPTOELECTRONIC DEVICES INCORPORATING CRYSTALLINE ORGANIC THIN FILMS

TECHNICAL FIELD

The present invention relates to integrated optoelectronic devices, and, more particularly, to such devices employing crystalline organic films having giant dielectric anisotropies, which permit the fabrication of polarization-selective devices.

BACKGROUND ART

Recent developments in the growth of a new class of materials made by several laboratories world-wide promise to expand the ability to engineer materials to obtain a broad range of optical and electronic properties optimized for numerous applications. This class of material combinations have a single feature in common: Layers of differing material compositions are bonded to each other via the highly flexible van der Waals force. Chief among such van der Waals solids are organic molecular semiconductors which have recently been demonstrated to grow epitaxially on potassium-halide crystals, sodium chloride, semiconductors, and metal substrates. Furthermore, combinations of two different van der Waals crystals with vastly different lattice constants have been observed by the inventors to grow in ordered, multilayer stacks with layer thicknesses of only a few Ångstroms.

These so-called quasi-epitaxial structures have enormous promise for use in a wide range of optical and electronic devices due to their non-linear optical and electronic properties. Indeed, the recent demonstration of quasi-epitaxy is particularly exciting, since it suggests that van der Waals bonds are sufficiently flexible to allow lattice-mismatched materials to form crystalline structures without inducing a high density of defects. This is in contrast to inorganic heterojunction systems consisting of mismatched combinations of materials, such as InP and InGaAsP.

Thus, new opportunities for engineering heterostructures consisting of a wide range of materials chosen without regard to the lattice-matching condition presents exciting possibilities in the field of optoelectronics. It should be noted that observation of quasi-epitaxy has not been confined only to materials combinations involving organic molecular crystals. In recent work, highly mismatched layers of dichalcogenide films have been grown in a quasi-epitaxy structure onto metal, semiconductor, and mica substrates as well.

DISCLOSURE OF INVENTION

In accordance with the invention, certain crystalline organic semiconductor compounds, such as 3,4,9,10-perylenetetracarboxylic dianhydride (PTCDA), when deposited by an ultrahigh vacuum process of organic molecular beam deposition, form highly ordered "quasi-epitaxial" films. Due to asymmetries in the molecular crystal structure of such compounds, the ordering of the films results in giant anisotropies in their dielectric properties. Such large dielectric anisotropies permit the construction of a variety of devices, including optical isolators, optically isolated lasers, optically isolated optical amplifiers, polarization-selective photodiodes, metal-organic-inorganic semiconductor-metal detectors, and numerous other polarization-selective devices incorporating integrated waveguide structures.

In particular, the polarization-selective devices comprise a layer of a crystalline organic semiconductor material having a difference in the in-plane and the out-of-plane indices of refraction of at least about 0.20. The crystalline organic semiconductor material is one that is process-compatible with conventional semiconductor processing.

The organic layer is formed on a layer of another material or materials whose index of refraction lies between the two indices of refraction of the organic layer; this second layer may be a substrate or a buffer layer formed thereon.

The optical devices of the invention polarize light from a source of optical radiation, and transmit specific modes while rejecting other modes.

BRIEF DESCRIPTION OF THE DRAWINGS

FIG. 2, on coordinates of power (in arbitrary units) and degrees of rotation, is a plot of the output light power as a function of polarization direction of input light for TM and TE modes;

FIG. 4b is a top plan view of the laser of FIG. 4a;

FIG. 7b is a top plan view of the detector of FIG. 7a.

BEST MODES FOR CARRYING OUT THE INVENTION

Fabrication of Organic Crystalline Semiconductor Structures

The description which follows is specifically directed to 3,4,9,10-perylenetetracarboxylic dianhydride (PTCDA). However, it will be appreciated that other organic crystalline semiconductor compounds may also be employed in the practice of the invention. All planar stacking molecules with a significant asymmetry along the several crystalline directions are suitably employed in the practice of the invention as described more fully below.

Figure 1A:
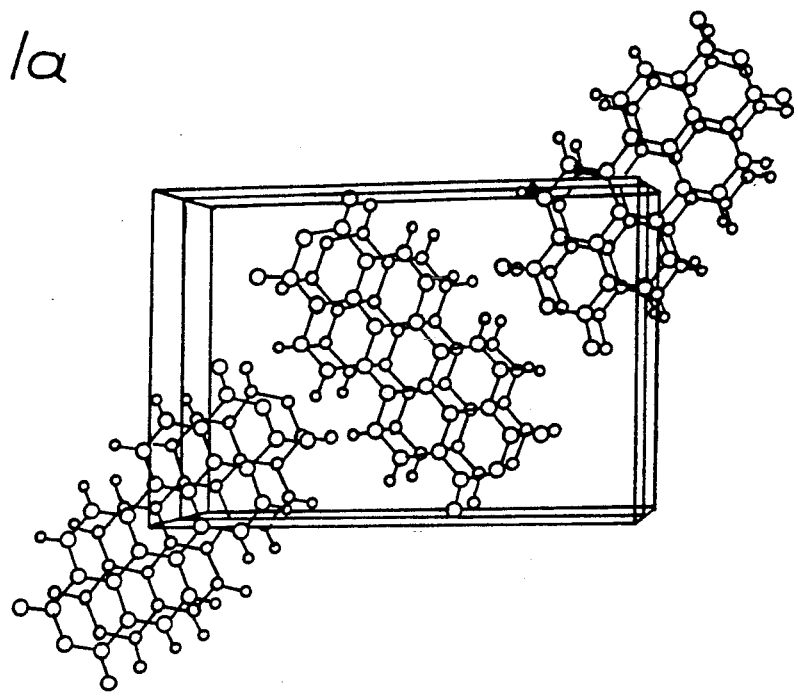
FIGS. 1a and 1b show two views of a unit cell of the archetype compound, 3,4,9,10-perylenetetracarboxylic dianhydride (PTCDA)
Figure 1B:
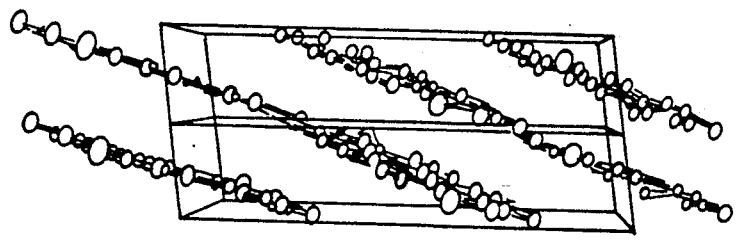

FIGS. 1a and 1b show two views of a unit cell of crystalline PTCDA. The molecules form planar stacks, with the distance between molecules in the stack of 3.21 Å. Typically, the films consist of such stacks tilted at $\varphi = 11°$ from the substrate normal. The long axes of molecules in adjacent stacks are rotated by 90° to the long axis of a molecule in the stack at the center of the unit cell.

The organic molecules useful in the practice of the invention are those which largely comprise planar stacking molecules and form crystalline phases. These molecules form regular crystalline stacks held together by van der Waals forces; they are not chemically bonded together. Such molecules are stable in ambient atmosphere and at temperatures ranging from low temperatures used in deposition on substrates up to at least 100° C.

A specific example of such molecules is given above (PTCDA). Classes of additional examples include polyacenes and porphyrins, such as the phthalocyanines. Polyacenes comprise two or more fused benzene rings or fused benzeneheterocyclic rings. Specific additional examples include 3,4,9,10-perylenetetracarboxyl-bis-benzimidazole, 3,4,9,10-perylenetetracarboxylic diimide, N,N'-dimethyl-3,4,9,10-perylenetetracarboxylic diimide, and derivatives thereof.

Functional groups may be present on the fused rings; examples include, but are not restricted to, imides, anhydrides, and benzene rings.

The stacking habit is also critical to the practice of the invention. Columnar is a preferred configuration, while herringbone, for example, is not. Columnar stacks, i.e., stacks composed of adjacent molecules positioned nearly directly parallel to each other and aligned, generally have a higher degree of dielectric anisotropy than do materials which form herringbone stacks. Here, herringbone stacking is characterized by adjacent molecules stacked approximately in a nested "V" formation. The stacking habit of a given molecular species is dependent on composition and conditions used in deposition, and is readily determined, using X-ray diffraction or other microanalytical tools familiar to those skilled in the art.

Crystalline organic films of PTCDA have been deposited by the ultrahigh vacuum process of organic molecular beam deposition (OMBD). When deposited onto substrates which are cooled to temperatures below about 150K, it is observed that they can form single crystalline sheets comprised of columnar stacks on a wide variety of substrates, including semiconductors such as GaAs, InP, and Si; insulators such as quartz and silicon nitride; and metals. By depositing the PTCDA on pre-etched ridges or in channels in the substrates, rib waveguide structures with widths less than about 2 $\mu$m have been achieved, provided that the index of refraction of the ridge or channel is less than that of the organic thin films, such as PTCDA.

Furthermore, it has been observed that films deposited in such a manner have giant anisotropies in their refractive indices. For example, the index of refraction of PTCDA in the substrate plane is $n_{ip}=2.017$, whereas perpendicular to the plane, $n_{pp}=1.36$. Due to this anisotropy, it is easy to find a wide variety of buffer layer materials whose index $n_b$ lies in the range:

$$n_{ip} > n_b > n_{pp}. \quad (1)$$

As used herein, "giant anisotropy" in refractive index characterized a material in which $\Delta = (n_{ip} - n_{pp}) \geq 0.20$.

Examples of such buffer materials include a wide range of conventional photoresists (e.g., AZ 1400, PMMP, etc.), $SiO_2$, $Si_3N_4$, and many compositions of $SiO_2N_y$, $SiN_x$, $SiN_y$, where $1 \geq x$, $y \geq 0$, $Al_2O_3$, and insulators having a refractive index less than about 2.0.

Thus, when PTCDA is layered onto such substrates following the relationship (1) above, the films will guide TE but not TM modes, as shown in FIG. 2.

FIG. 2 depicts light output power (in arbitrary units) from a 1 cm long PTCDA waveguide as a function of the polarization direction of input light (in degrees). Curve 10 depicts the TE mode, while Curve 12 depicts the TM mode.

Figure 2A:
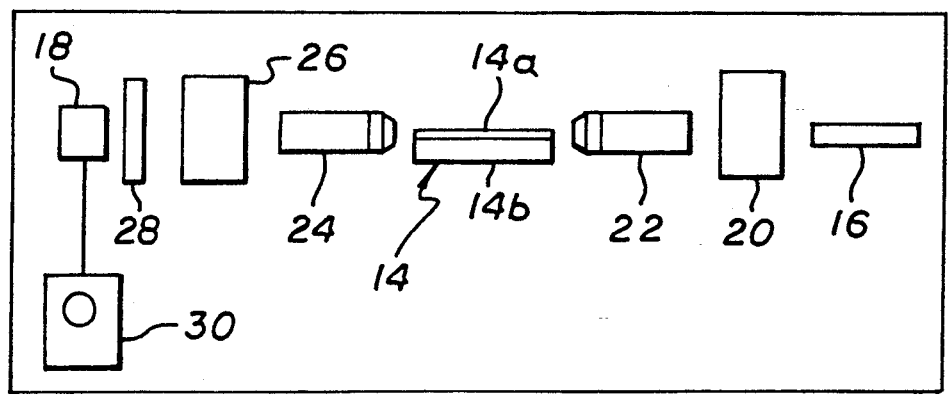
FIG. 2a is a schematic diagram of the apparatus used to generate the curves of FIG. 2.

The apparatus used to generate the plot shown in FIG. 2 is depicted in FIG. 2a. The waveguide device 14, comprising a waveguide layer 14a, for example PTCDA, deposited on, for example, an InP substrate 14b with a ridge of, for example, AZ 1400 photoresist, is placed between a laser 16 and a detector 18. A diode-pumped YAG ring laser radiating at 1.06 $\mu$m wavelength was employed. The linear polarization of the laser 16 is continuously adjustable to any direction by rotating a quarter wave plate (not shown) in the laser without moving the light spot position. A Glan-Thompson polarizer 20 having an extinction ratio $\approx 50$ dB was placed in front of the laser 16. This set-up provides stable, linearly polarized light power where the polarization angle could be oriented in any direction, and ensures a constant coupling efficiency.

The rotatable, linearly polarized light then is focussed onto the waveguide device 14 by lens 22. A second lens 24 collimates light output from by the waveguide device 14. The light is then passed through another Glan-Thomson polarizer 26, prior to being received by the detector 18. The analyzer-polarizer 26 serves to ensure that the light coming out of the device 14 is either in the TE or TM mode. Next, the light is passed through an adjustable iris 28 onto the detector 18. The iris 28 minimizes the amount of scattered light entering the detector 18. The output from the detector 18, here a Si CCD camera, is viewed on an oscilloscope 30.

FIG. 2 shows that 2 $\mu$m wide PTCDA ridge waveguides deposited onto AZ 1400 stripes had a TM/TE mode selectivity of $>48$ dB (extinction ratio $< -48$ dB) at a wavelength of $\lambda = 1.064$ $\mu$m (with similar results at $\lambda = 1.3$ $\mu$m), for a waveguide 10 mm in length. The TE loss for the 10 mm guide was 2.5 dB. Similar results were obtained for a waveguide having a length of 1.5 mm, in which an extinction ratio of TM/TE $<< -25$ dB was measured. The TE propagation loss of the short guide was found to be $<0.4$ dB.

In previous work, the inventors have found that PTCDA deposited under similar conditions had losses $<2.5$ dB/cm for TE modes. Hence, PTCDA films can have a very high mode selectivity accompanied with very low losses for the guided mode.

Due to its compatibility with a wide variety of substrates, PTCDA deposited by OMBD on cold substrates therefore presents the possibility for forming a wide array of highly polarization-selective devices which can be integrated with conventional semiconductor devices. This is apparently a unique capability which is limited to asymmetric organic crystalline solids which can be deposited in such an oriented fashion. Those organic compounds which form planar stacks of spatially asymmetric molecules, described above, will all lend themselves to this process. Hence, molecules based on perylene, naphthalene, other polyacenes, and porphyrins, such as the phthalocyanines, are expected to find use in the practice of the invention. Examples of specific devices which take advantage of the observed polarization property of PTCDA and similar molecules are shown in FIGS. 3-6. A brief description of each of the devices follows.

Optical Isolator

Figure 3:
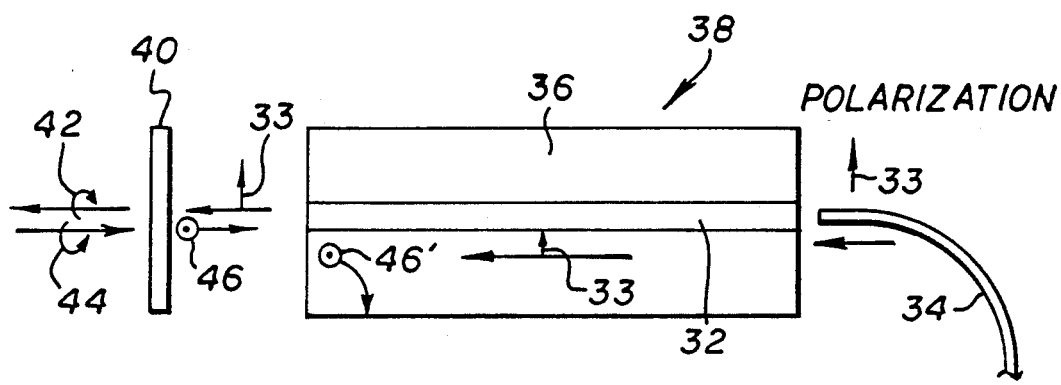
FIG. 3 is a top plan view of an optical isolator of the invention, employing a channel waveguide of an organic compound which forms planar stacks of spatially asymmetric molecules, e.g., that shown in FIG. 1.

As shown in FIG. 3, unpolarized light is launched into the PTCDA guide 32 from, for example, an optical fiber 34; only TE modes 33 are propagated in the waveguide. The PTCDA waveguide 32 is formed on the surface of a substrate 36, as described above, to form a TE pass polarizer 38. Using any of the substrate materials described above, the condition of Eqn. (1) is satisfied.

This polarized light is then passed through a quarter wave plate 40, thus producing circularly polarized light, as shown at 42. On reflection from any surface in the far field (not shown), the light returns with the opposite handedness of circular polarization, as shown at 44. Once it returns through the quarter wave plate 40, it is linearly polarized perpendicular to that of the outgoing mode, as shown at 46, and hence cannot be guided by the PTCDA waveguide 32, but rather passes into the substrate, as shown at 46'. This device then strongly isolates the source from any reflected light.

It will be noted that if in the output, linearly polarized light is desired rather than circular polarization, the quarter wave plate 40 can be replaced by a device which rotates the linear polarization by 45°, such as a Faraday rotator.

Because of the possibility of depositing such organic films onto a diversity of substrates, the optical isolator device may be used as a Brewster window or as an optical isolator integrated with semiconductor lasers (as described more fully below).

Optically Isolated Laser

Optically isolated lasers are in great demand for use in coherent optical communication systems where reflection of light emitted by a laser can strongly influence the spectral and temporal response of the laser in an unwanted manner.

Figure 4A:
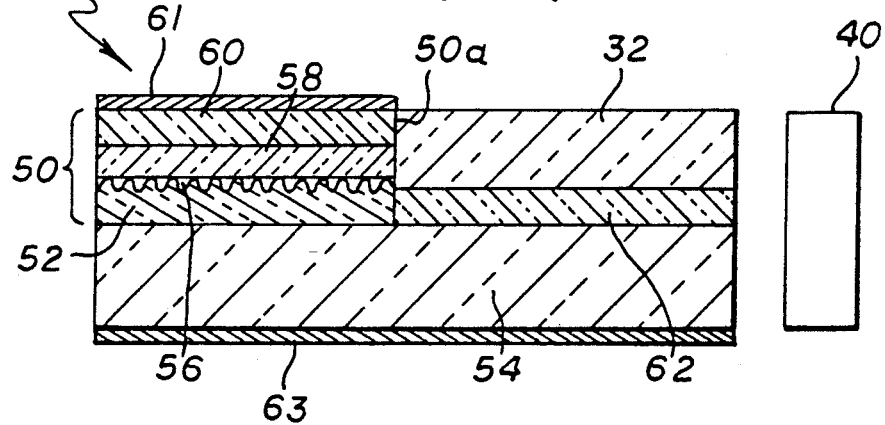
FIG. 4a is a cross-sectional view of an optically isolated layer, here a distributed feedback laser, resulting from the combination of the laser with a waveguide of the organic compound of FIG. 1, formed on a common substrate.
Figure 4B:
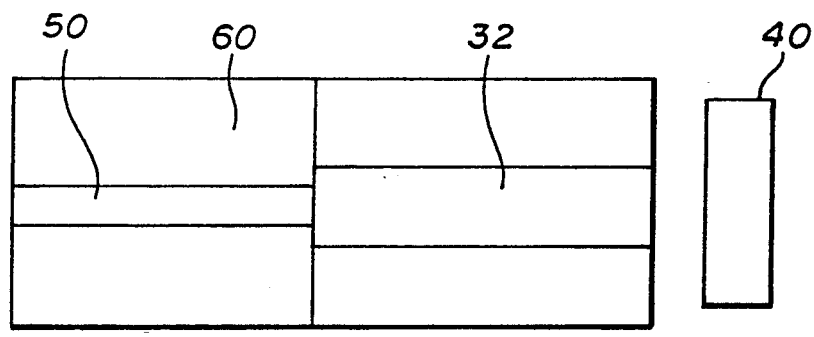

An example of such a device 48 is shown in FIGS. 4a and 4b, in which the polarizing layer 32 is integrated with the laser 50, thereby providing a very compact, potentially inexpensive optically isolated laser. In FIGS. 4a and 4b, a PTCDA layer 32 is shown deposited directly onto the front facet 50a of a distributed feedback (DFB) laser 50 as a preferred embodiment of the invention.

As shown more clearly in FIG. 4a, a typical embodiment consists of the laser 50 comprising an n-type buffer layer 52 formed on an n-type substrate 54.

An n-type grating layer 56 is then formed by etching the buffer layer 52 to provide gain for a single longitudinal mode, as is conventional to DFB laser design. The narrow bandgap active layer 58, or light emitting layer, of the laser is then formed on the large bandgap grating layer 56. Typically, the light emitting layer 58 is formed of GaAs or InGaAsP for emission in the 0.8 μm, 1.3 μm, or 1.55 μm wavelength bands, as required by the particular application. A large bandgap cap layer 60 for waveguide cladding and contact by a metal contact 61 is then formed on the cap layer 60.

The PTCDA layer 32 is formed on a buffer layer 62, which is formed on the substrate 54. The buffer layer 62 is composed of any material satisfying Eqn. (1), such as SiO$_2$. Thus, the waveguide as shown will guide TE but not TM modes emitted by the laser diode 50.

A back contact 63 is formed on the back surface of the substrate 54. To complete the optical isolation, a quarter wave plate 40 or Faraday rotator is placed in front of the polarizing guide.

Optically Isolated Optical Amplifier

Figure 5:
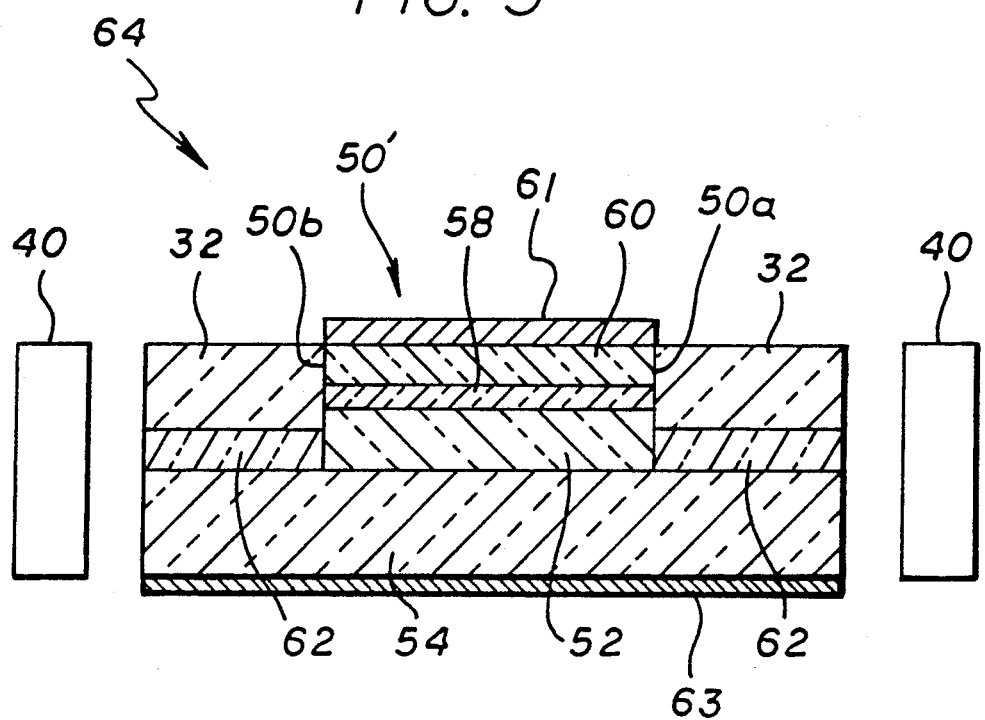
FIG. 5 is a cross-sectional view of an optically isolated optical amplifier in accordance with the teachings of the invention.

A key component of any very long distance or high bandwidth optical communication system is an optical amplifier. The structure of a semiconductor optical amplifier 64, shown in FIG. 5, is identical to that of a semiconductor laser, except that the end facets 50a, 50b of the laser 50' are anti-reflection-coated to prevent any optical feedback from entering the active gain region 58 of the amplifier, which would cause it to oscillate.

Of equal importance is for the amplifier to be optically isolated from its environment, since reflections from lenses or optical fibers will cause it to oscillate. Hence, integrated anisotropic organic thin films 32 such as PTCDA can be used to fabricate optically isolated laser amplifiers 64 such as that shown in FIG. 5.

The device is similar to that depicted in FIG. 4, except that this device is isolated from refections from both sides.

Polarization-Selective Photodiode

Figure 6:
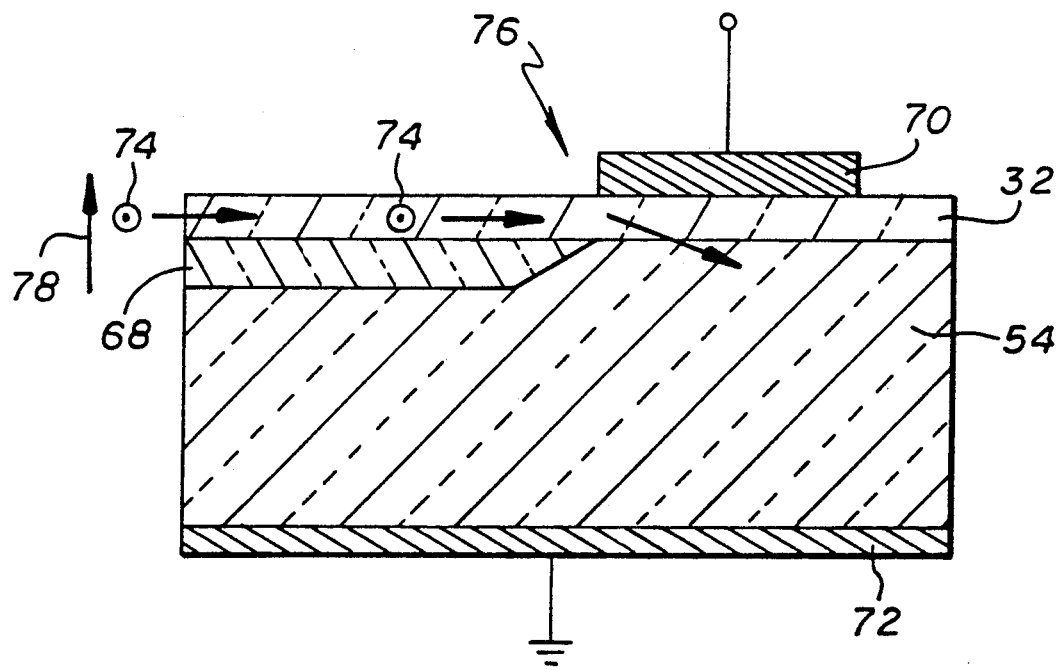
FIG. 6 a cross-sectional view of a polarization-selective photodiode, employing a waveguide of the organic compound of FIG. 1.

In this example, advantage is taken of the well-known ability of organic films 32 such as PTCDA to form highly rectifying heterojunctions when layered onto inorganic semiconductor substrates 54. As shown in FIG. 6, the organic waveguide layer 32 is formed over a buffer layer 68, which terminates so that the organic film is in direct contact with the substrate 54. A metal contact 70 is formed over that portion of the organic film 32 in direct contact with the substrate 54. A second metal contact 72 is formed on the backside of the device.

In the region underneath the metal contact 70, the organic film 32, which contacts the inorganic semiconductor, forms a highly sensitive, low dark current avalanche photodiode which is sensitive to light injected along the waveguide. It will be noted that in the region beneath the contact pad, the index of refraction of the semiconductor substrate ($n_{sub}$) is larger than that of PTCDA. Typically, $n_{sub}=3.4>n_{ip}$, $n_{pp}$. A depletion region is formed under the contact pad 70 by reverse biasing the heterojunction formed between the organic and inorganic semiconductors; consequently, the guided modes in the organic waveguide are absorbed and are detected in this region of the diode. By appropriate choice of buffer layer material, only TE modes, shown at 74, can propagate in the lateral guide 32, and hence be detected in the integrated detector 76. For comparison, TM modes, shown at 78 entering the device, are not guided in the device. This condition exists when the index of refraction of the buffer layer is chosen to satisfy Eqn. (1).

Thus, the detector is polarization-selective. Such a device has potential applications in numerous systems, such as fiber taps or in networks where data is routed according to the polarization of the signal light.

Metal-Organic-Inorganic Semiconductor-Metal Detectors

Figure 7A:
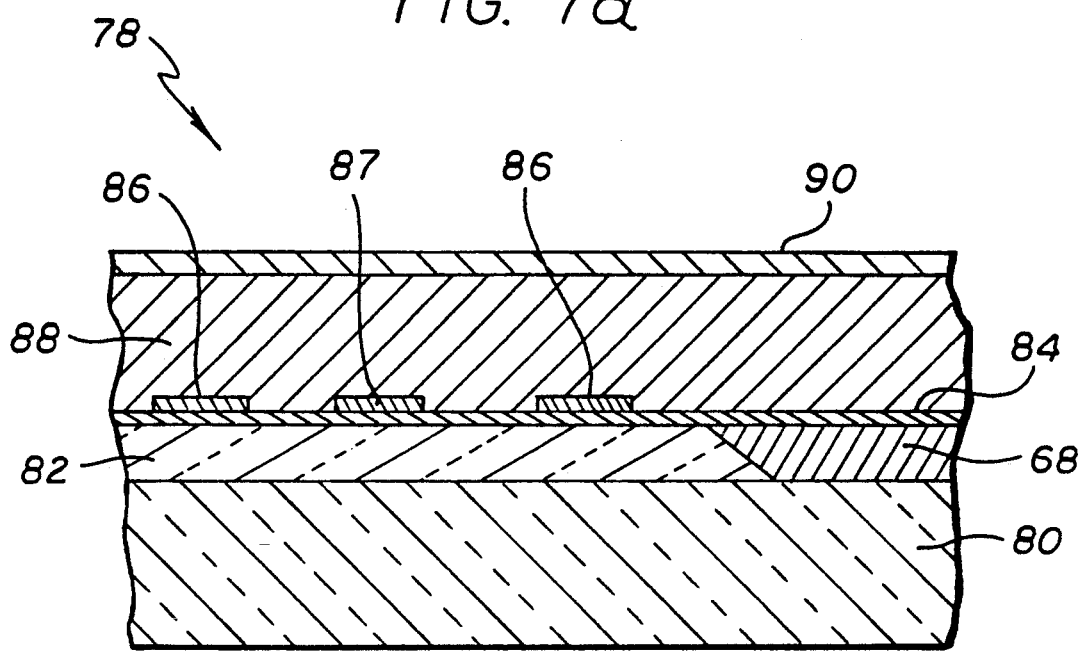
FIG. 7a is a cross-sectional view of a metal-organic-inorganic semiconductor-metal detector, in accordance with another embodiment of the invention.
Figure 7B:
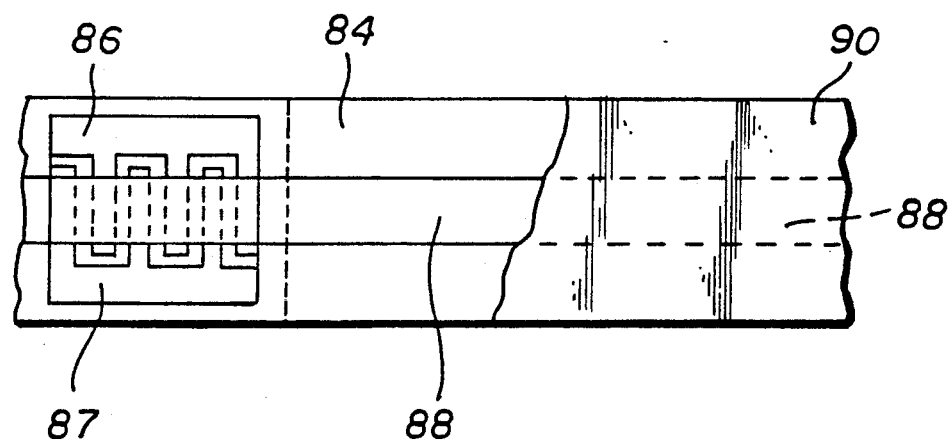

FIGS. 7a and 7b depict an edge-coupled metal-organic-inorganic semiconductor-metal (MOISM) detector 78. The device comprises a substrate 80, here, of semi-insulating InP, and a semiconductor layer 82 formed thereon. The semiconductor layer 82 here is InGaAs.

As in the polarization-selective photodiode, an organic layer 84 is formed over a buffer layer 68, which terminates so that the organic film is in direct contact with the semiconductor layer 82.

The continuous organic layer 84 permits formation of back-to-back diodes, which are formed by interdigitated "fingers" of ohmic metal contacts 86, 87 thereon. The thinnest possible organic film is used, since it is required that these devices have high bandwidth response. Typically, the thickness of the organic layer 84, e.g., PTCDA, is less than about 50 Å. This organic layer provides organic-inorganic heterojunction contact. Further, use of this layer permits placing the detecting and waveguiding (described below) functions on separate organic layers, which permits optimizing each layer independently.

The width of the ohmic metal contact fingers 86, 87 is less than about 2 μm, with finger separations of about the same dimension. The interdigitated fingers of ohmic metal contacts 86, 87 comprise the detector portion of the device. The ohmic contacts typically comprise titanium/platinum/gold.

Light is "edge-coupled" to the device 78 by injecting it along an organic thin film parallel to the wafer surface. In the guiding regions, the organic material is grown onto the surface of the buffer layer 68, which here is plasma CVD-deposited $SiO_2$, to prevent absorption in the substrate. As is seen in FIG. 7a, there is no buffer layer 68 in the active device region. The minimum thickness to support guiding of a single TE mode, for polarization selectivity, in the PTCDA layer is about 1,200 Å. To maintain device speed, therefore, the waveguide PTCDA layer 88 is deposited on top of the detector portion of the device, as shown in FIG. 7a. A passivation layer 90 is provided on top of the waveguide layer 88.

This detector is positioned adjacent the $SiO_2$ buffer layer 68, such that the incident light enters from the waveguide 88 through the spaces between the fingers, just as if the light were incident normal to the surface in a top-illuminated geometry.

One advantage to the edge-coupled device is that the quantum efficiency is expected to be higher than for normally incident light, since light reflected off of the buried contact fingers 86 may remain in the guide, to be absorbed further downstream. Also, the device can be kept very small. Assuming a 10 μm wide rib waveguide, the total device dimension could be as small as 15 μm×50 μm to absorb all of the incident radiation.

The principle advantage of the waveguide-coupled device is its integratability with electro-optic modulators and other optical components to which the organic-inorganic technology easily lends itself.

It will be understood that the above-described devices are exemplary of those devices which can make use of integrated waveguides which can polarize either incoming or outgoing light. The concept of integrated polarizing waveguides can be applied to a large range of device structures using anisotropic organic thin films similar to those described herein and hence the specific devices disclosed herein are not meant to limit either the spirit or scope of the invention, but merely to serve as examples of the wide variety of devices that may be constructed in accordance with the teachings of the invention.

Each of the polarization-selective devices described above incorporates at least one integrated waveguide structure, which is disposed on a substrate (or a buffer layer thereon) and comprises a layer of a crystalline organic semiconductor material capable of forming an asymmetric crystalline structure in thin film form. The organic semiconductor material has a first index of refraction as measured in the plane of the layer and a second index of refraction as measured perpendicular thereto, the difference between the first index of refraction and the second index of refraction being at least about 0.20. Further, the substrate (or buffer layer) comprises a material having an index of refraction between that of the first index of refraction and the second index of refraction. This structure is common to all polarization-selective devices based on the teachings of this invention.

The waveguide may be formed on a pre-etched ridge formed on the substrate (or buffer layer) or formed in a channel therein.

Growth of Organic Crystalline Layers

The inventors have fabricated devices such as those described above by organic molecular beam deposition (OMBD) at a base pressure in the mid-$10^{-10}$ Torr range. The apparatus for organic molecular beam deposition of films is not novel per se, and is disclosed elsewhere; see, e.g., *Growth of Semiconductor Structures and High-Tc Thin Films on Semiconductors*, SPIE Proceedings, Vol. 1285, pp. 95-103 (20-21 March 1990). Essentially, a purified source of PTCDA is loaded into an organic sublimation cell with exit port directed towards a substrate onto which deposition is to be made.

The growth of the organic crystalline layers is preferably done at a pressure of less than about $10^{-6}$ Torr and most preferably at a pressure of less than about $5 \times 10^{-8}$ Torr.

The growth is achieved by heating a sublimation cell in which a small amount of the organic material (in solid form) is contained. For PTCDA, a temperature of about 450° C. is advantageously employed, providing a growth rate of approximately 1 to 3 Å/sec; and in any event less than about 5 Å/sec. Growth rates exceeding about 5 Å/sec for PTCDA result in the formation of polycrystalline films, and thus are to be avoided. The extent of heating the sublimation cells controls the growth rate. That is, higher deposition rates are achieved by increasing the source cell temperature. Temperatures must be kept below the molecular decomposition temperature, which is generally about 100° to 300° C. higher than the sublimation temperature. In any event, it is rate and not temperature which is controlled during deposition. Rates of <5 Å/sec for PTCDA require source temperatures well below the thermal decomposition temperature.

The substrate is maintained at a temperature below about 150K during deposition. Good surface morphology is attained at a substrate temperature below about 150K, while polycrystallinity of the film is avoided by maintaining the substrate temperature above about 70K. Preferably, the substrate is maintained in the range of about 70 to 120K. Also, when deposition occurs within this temperature range, the PTCDA is deposited in single crystalline form, thereby giving rise to very low propagation loss (<2.5 dB at $\lambda = 1.06$ μm) waveguides. It is understood that the optimum substrate temperature required to achieve single crystalline deposition of crystalline organic semiconductors other than PTCDA may lie outside the range of 70 to 120K. However, the optimum temperature range for a given organic compound is easily found using conventional analysis methods such as film birefringence or X-ray analysis which reveal the crystalline texture of the deposited films.

As an example, PTCDA layers were grown at a pressure of approximately $10^{-8}$ Torr, with the substrate temperature maintained below 120K. The layer thickness in this typical embodiment was varied from 1,000 to 10,000 Å to form low loss single mode waveguides at $\lambda = 1.064$ μm or 1.3 μm.

The growth rate and thickness for these layers were measured using a conventional crystal thickness monitor. Good surface morphology and sharp interfaces were achieved by growing organic thin films at substrate temperatures below about 150K and preferably below about 120K. For comparison, films were also grown at a substrate temperature of 440K. At such a substrate temperature, 0.2 μm diameter grains were typically observed. Such a polycrystalline material has very high propagation losses. On the other hand, a very smooth surface and low propagation loss was obtained for films deposited at a substrate temperature of 90K. For this reason, the substrate temperature during growth was kept at 90K. In the preferred embodiment of the invention, the maximum deposition rate utilized is about 5 Å per second and the thickest layer deposited is about 2 μm.

The preferred method employed a source to substrate distance of about 10 to 35 cm and a pressure not greater than $10^{-6}$ Torr. After deposition, the deposited products were allowed to heat slowly back up to room temperature over a period of from three to four hours. It is important to allow for the film to warm up over this period of time to avoid cracking which occurs when the film is rapidly warmed.

INDUSTRIAL APPLICABILITY

It is expected that the use of crystalline organic semiconductor films having large anisotropies in their dielectric properties, such as PTCDA, will find use in polarization-selective integrated optoelectronic devices.

EXAMPLES

Example 1

A single mode crystalline organic waveguide polarizer was fabricated, comprising a 1 μm thick PTCDA thin film deposited by OMBD on a 2 μm width AZ 1400 photoresist strip, patterned by conventional photolithography, which was the buffer layer on a (100) InP substrate. End facets to the polarizer were formed by cleaving the substrate along the (110) planes. Device lengths of 10 mm and 1.5 mm were used. A plan view of the device is shown in FIG. 2.

The refractive indices of PTCDA thin films along the TE direction, InP, and photoresist were 2.017, 3.27, and 1.61 at $\lambda = 1.064$ μm, respectively. The refractive index of the PTCDA thin film along the TM direction was only 1.36, which was much lower than that of the photoresist buffer layer. Thus, the PTCDA rib waveguides only supported TE modes. The polarizer showed a strong $TE_{00}$ mode output, with a typical propagation loss of 2.5 dB/cm. The TM/TE isolation ratio for the 10 mm guide was $< -48$ dB, and for the 1.5 mm guide was $<< -25$ dB.

Example 2

A single mode crystalline organic waveguide polarizer was fabricated as in Example 1, except that a waveguide width of 4 μm was used. The guide exhibited $TE_{01}$ modes; no TM mode propagation was observed.

Example 3

A single mode crystalline organic waveguide polarizer was fabricated as in Example 1, except that a waveguide width of 6 μm was used. The guide exhibited $TE_{02}$ modes; no TM mode propagation was observed.

Example 4

A single mode crystalline organic waveguide polarizer was fabricated as in Example 1, except that a waveguide width of 8 μm was used. The guide exhibited $TE_{03}$ modes; no TM mode propagation was observed.

Example 5

Slab waveguides (1 μm thick) were formed on quartz substrates (index of refraction $\approx 1.5$). The waveguides exhibited $TE_0$, $TE_1$, and $TE_2$ modes coupled into the guides using both end fire and grating coupling methods. No TM mode propagation was observed.

What is claimed is:

1. A polarization-selective device incorporating at least one integrated waveguide structure, said at least one waveguide structure disposed on a substrate (36, 54) and comprising a layer (32) of a crystalline organic semiconductor material comprising an asymmetric crystalline structure, said material having a first index of refraction as measured in the plane of said layer and a second index of refraction as measured perpendicular thereto, the difference between said first index of refraction and said second index of refraction being at least about 0.20, said substrate comprising a material having an index of refraction between that of said first index of refraction and said second index of refraction.

2. The polarization-selective device of claim 1 wherein said organic semiconductor material comprises a member selected from the group consisting of polyacenes and porphyrins.

3. The polarization-selective device of claim 2 wherein said organic semiconductor material consists essentially of 3,4,9,10-perylenetetracarboxylic dianhydride, 3,4,9,10-perylenetetracarboxyl-bis-benzimidazole, 3,4,9,10-perylenetetracarboxylic diimide, N,N'-dimethyl-3,4,9,10-perylenetetracarboxylic diimide, and derivatives thereof.

4. The polarization-selective device of claim 1 wherein said substrate is selected from the group consisting of photoresists, $SiO_2$, $Si_3N_4$, $SiO_xN_y$, $SiN_y$, where $1 \geq x$, $y \geq 0$, $Al_2O_3$, and insulators having a refractive index less than about 2.0.

5. The polarization-selective device of claim 1 wherein said waveguide is formed on a pre-etched ridge formed on said substrate.

6. The polarization-selective device of claim 1 wherein said waveguide is formed in a channel formed on said substrate.

7. An optical device for polarizing light from a source of optical radiation including:

(a) a layer (32) of a crystalline organic semiconductor material capable of forming an asymmetric crystalline structure in thin film form, said material having a first index of refraction as measured in the plane of said layer and a second index of refraction as measured perpendicular thereto, the difference between said first index of refraction and said second index of refraction being at least about 0.20; and (b) a substrate (36, 54) supporting said layer of organic semiconductor material, said substrate comprising a material having an index of refraction between that of said first index of refraction and said second index of refraction.

8. The optical device of claim 7 wherein said organic semiconductor material comprises a member selected from the group consisting of polyacenes and porphyrins.

9. The optical device of claim 8 wherein said organic semiconductor material consists essentially of 3,4,9,10-perylenetetracarboxylic dianhydride, 3,4,9,10-perylenetetracarboxyl-bis-benzimidazole, 3,4,9,10-perylenetetracarboxylic diimide, N,N'-dimethyl-3,4,9,10-perylenetetracarboxylic diimide, and derivatives thereof.

10. The optical device of claim 7 wherein said substrate is selected from the group consisting of photoresists $SiO_2$, $Si_3N_4$, $SiO_xN_y$, $SiN_y$, where $1 \geq x$, $y \geq 0$, $Al_2O_3$, and insulators having a refractive index less than about 2.0.

11. The optical device of claim 7 wherein said waveguide is formed on a pre-etched ridge formed on said substrate.

12. The optical device of claim 7 wherein said waveguide is formed in a channel formed on said substrate.

13. An optical isolator (38) comprising a waveguide formed on a substrate (54), said waveguide consisting essentially of a layer (32) of a crystalline organic semiconductor material capable of forming an asymmetric crystalline structure in thin film form, said material having a first index of refraction as measured in the plane of said layer and a second index of refraction as measured perpendicular thereto, the difference between said first index of refraction and said second index of refraction being at least about 0.20, said substrate comprising a material having an index of refraction between that of said first index of refraction and said second index of refraction, said isolator adapted to be interposed between a source (34) of optical radiation and a polarization-modifying element (40) for isolating said source (34) of optical radiation from any reflected optical radiation from any surface in the far field.

14. The optical isolator of claim 13 wherein said organic semiconductor material comprises a member selected from the group consisting of polyacenes and porphyrins.

15. The optical isolator of claim 14 wherein said organic semiconductor material consists essentially of 3,4,9,10-perylenetetracarboxylic dianhydride, 3,4,9,10-perylenetetracarboxyl-bis-benzimidazole, 3,4,9,10-perylenetetracarboxylic diimide, N,N'-dimethyl-3,4,9,10-perylenetetracarboxylic diimide, and derivatives thereof.

16. The optical isolator of claim 13 wherein said substrate is selected from the group consisting of photoresists, $SiO_2$, $Si_3N_4$, $SiO_xN_y$, $SiN_y$, where $1 \geq x$, $y \geq 0$, $Al_2O_3$, and insulators having a refractive index less than about 2.0.

17. The optical isolator of claim 13 wherein said polarization-modifying element comprises a quarter wave plate.

18. The optical isolator of claim 13 wherein said polarization-modifying element comprises a Faraday rotator.

19. An optically isolated semiconductor laser (48) comprising:

(a) a diode laser (50) formed on a substrate (54), said laser having a front emitting surface (50a) adapted t emit optical radiation parallel to said substrate;

(b) a waveguide formed over said substrate, said waveguide terminating at one end at said front emitting surface of said laser and consisting essentially of a layer (32) of a crystalline organic semiconductor material capable of forming an asymmetric crystalline structure in thin film form, said material having a first index of refraction as measured in the plane of said layer and a second index of refraction as measured perpendicular thereto, the difference between said first index of refraction and said second index of refraction being at least about 0.20; and (c) a polarization-modifying element (40) disposed at another end of said waveguide for changing the polarization status of optical radiation emitted by said laser and guided by said waveguide onto said polarization-modifying element.

20. The optically isolated laser of claim 19 wherein said organic layer is formed on said substrate, which comprises a material having an index of refraction between that of said first index of refraction and said second index of refraction.

21. The optically isolated laser of claim 19 wherein said organic layer is formed on a buffer layer (62) formed on said substrate, said buffer layer comprising a material having an index of refraction between that of said first index of refraction and said second index of refraction.

22. The optically isolated laser of claim 21 wherein said buffer layer is selected from the group consisting of photoresists, $SiO_2$, $Si_3N_4$, $SiO_xN_y$, $SiN_y$, where $1 \geq x$, $y \geq 0$, $Al_2O_3$, and insulators having a refractive index less than about 2.0.

23. The optically isolated laser of claim 19 wherein said organic semiconductor material comprises a member selected from the group consisting of polyacenes and porphyrins.

24. The optically isolated laser of claim 23 wherein said organic semiconductor material consists essentially of 3,4,9,10-perylenetetracarboxylic dianhydride, 3,4,9,10-perylenetetracarboxyl-bis-benzimidazole, 3,4,9,10-perylenetetracarboxylic diimide, N,N'-dimethyl-3,4,9,10-perylenetetracarboxylic diimide, and derivatives thereof.

25. The optically isolated laser of claim 19 wherein said polarization-modifying element comprises a quarter wave plate.

26. The optically isolated laser of claim 19 wherein said polarization-modifying element comprises a Faraday rotator.

27. An optically isolated optical amplifier (64) comprising:

(a) a diode laser (50') formed on a substrate, said laser having front and rear emitting surfaces (50a, 50b) adapted to emit optical radiation parallel to said substrate, said emitting surfaces provided with an anti-reflection coating;

(b) waveguides formed over said substrate, one said waveguide terminating at one end at said front emitting surface of said optical amplifier and another said waveguide terminating at one end at said rear emitting surface of said optical amplifier, said waveguides each consisting essentially of a layer (32) of a crystalline organic semiconductor material capable of forming an asymmetric crystalline structure in thin film form, said material having a first index of refraction as measured in the plane of said layer and a second index of refraction as measured perpendicular thereto, the difference between said first index of refraction and said second index of refraction being at least about 0.20; and (c) a polarization-modifying element (40) disposed at another end of each of said waveguides for changing the polarization status of optical radiation emitted by said laser and guided by said waveguide onto said polarization-modifying element.

28. The optically isolated amplifier of claim 27 wherein said organic layer is formed on said substrate, which comprises a material having an index of refraction between that of said first index of refraction and said second index of refraction.

29. The optically isolated amplifier of claim 27 wherein said organic layer is formed on a buffer layer (62) formed on said substrate, said buffer layer comprising a material having an index of refraction between that of said first index of refraction and said second index of refraction.

30. The optically isolated amplifier of claim 29 wherein said buffer layer is selected from the group consisting of photoresists, $SiO_2$, $Si_3N_4$, $SiO_xN_y$, $SiN_y$, where $1 \geq x$, $y \geq 0$, $Al_2O_3$, and insulators having a refractive index less than about 2.0.

31. The optically isolated amplifier of claim 27 wherein said organic semiconductor material comprises a member selected from the group consisting of polyacenes and porphyrins.

32. The optically isolated amplifier of claim 31 wherein said organic semiconductor material consists essentially of 3,4,9,10-perylenetetracarboxylic dianhydride, 3,4,9,10-perylenetetracarboxyl-bis-benzimidazole, 3,4,9,10-perylenetetracarboxylic diimide, N,N'-dimethyl-3,4,9,10-perylenetetracarboxylic diimide, and derivatives thereof.

33. The optically isolated amplifier of claim 27 wherein said polarization-modifying element comprises a quarter wave plate.

34. The optically isolated amplifier of claim 27 wherein said polarization-modifying element comprises a Faraday rotator.

35. A polarization-selective photodiode (76) comprising:

(a) a substrate (54) having two major surfaces, a first major surface which supports thereon a buffer layer (68) which terminates within said substrate;

(b) a waveguide layer (32) formed on said buffer layer and extending therebeyond onto said substrate, said waveguide layer consisting essentially of an organic semiconductor material capable of forming an asymmetric crystalline structure in thin film form, said material having a first index of refraction as measured in the plane of said layer and a second index of refraction as measured perpendicular thereto, the difference between said first index of refraction and said second index of refraction being at least about 0.20, said buffer layer having an index of refraction between said first index of refraction and said second index of refraction;

(c) a first metal contact (72) formed on a second major surface of said substrate, opposite that supporting said waveguide layer; and (d) a second metal contact (70) formed on said waveguide layer overlying said substrate beyond the termination of said buffer layer.

36. The polarization-selective photodiode of claim 35 wherein said organic semiconductor material comprises a member selected from the group consisting of polyacenes and porphyrins.

37. The polarization-selective photodiode of claim 36 wherein said organic semiconductor material consists essentially of 3,4,9,10-perylenetetracarboxylic dianhydride, 3,4,9,10-perylenetetracarboxyl-bis-benzimidazole, 3,4,9,10-perylenetetracarboxylic diimide, N,N'-dimethyl-3,4,9,10-perylenetetracarboxylic diimide, and derivatives thereof.

38. The polarization-selective photodiode of claim 36 wherein said buffer layer is selected from the group consisting of photoresists, $SiO_2$, $Si_3N_4$, $SiO_xN_y$, $SiN_y$, where $1 \geq x$, $y \geq 0$, $Al_2O_3$, and insulators having a refractive index less than about 2.0.

39. A metal-organic-inorganic semiconductor-metal detector (78) supported on a substrate (80) comprising:

(a) a detector portion, comprising:
(1) a first organic layer (84) formed over said substrate,
(2) a plurality of ohmic metal contact fingers (86, 87) formed thereon; and (b) a waveguiding portion, comprising:
(1) a buffer layer (68) formed on said substrate and terminating prior to said detector portion, and
(2) a second organic layer (88) formed on said buffer layer and extending therebeyond onto said detector portion, said second organic layer consisting essentially of an organic semiconductor material capable of forming an asymmetric crystalline structure in thin film form, said material having a first index of refraction as measured in the plane of said layer and a second index of refraction as measured perpendicular thereto, the difference between said first index of refraction and said second index of refraction being at least about 0.20, said buffer layer having an index of refraction between said first index of refraction and said second index of refraction.

40. The detector of claim 39 wherein said first and second organic semiconductor material comprises a member selected from the group consisting of polyacenes and porphyrins.

41. The detector of claim 40 wherein said first and second organic semiconductor material consists essentially of 3,4,9,10-perylenetetracarboxylic dianhydride, 3,4,9,10-perylenetetracarboxyl-bis-benzimidazole, 3,4,9,10-perylenetetracarboxylic diimide, N,N'-dimethyl-3,4,9,10-perylenetetracarboxylic diimide, and derivatives thereof.

42. The detector of claim 39 wherein said buffer layer is selected from the group consisting of photoresists, $SiO_2$, $Si_3N_4$, $SiO_xN_y$, $SiN_y$, where $1 \geq x$, $y \geq 0$, $Al_2O_3$, and insulators having a refractive index less than about 2.0.

43. The detector of claim 39 further including a passivating layer (90) formed on said second organic layer.

* * * * *